United States Patent [19]
Gardner et al.

[11] Patent Number: 6,107,150
[45] Date of Patent: Aug. 22, 2000

[54] METHOD OF MAKING HIGH PERFORMANCE TRANSISTORS USING CHANNEL MODULATED IMPLANT FOR ULTRA THIN OXIDE FORMATION

[75] Inventors: Mark I. Gardner, Cedar Creek; H. Jim Fulford, Austin, both of Tex.

[73] Assignee: Advanced Micro Devices, Inc., Austin, Tex.

[21] Appl. No.: 09/148,095

[22] Filed: Sep. 4, 1998

[51] Int. Cl.[7] .................................................. H01L 21/336
[52] U.S. Cl. ........................ 438/305; 408/308; 408/199; 408/225; 408/588
[58] Field of Search ..................................... 438/305, 286, 438/308, 231, 513, 585, 199, 225, 588, 692

[56] References Cited

U.S. PATENT DOCUMENTS

| | | | |
|---|---|---|---|
| 4,683,637 | 8/1987 | Varker et al. | 437/63 |
| 4,925,805 | 5/1990 | Van Ommen et al. | 437/21 |
| 5,861,335 | 1/1999 | Hause et al. | 438/308 |
| 5,972,783 | 10/1999 | Arai et al. | 438/513 |
| 5,975,912 | 11/1999 | Hillman et al. | 437/245 |

*Primary Examiner*—Matthew Smith
*Assistant Examiner*—Victor Yevsikov
*Attorney, Agent, or Firm*—Williams, Morgan & Amerson, P.C.

[57] ABSTRACT

The present invention is directed to a semiconductor device having an ultra thin gate oxide and a method for making same. The method is comprised of implanting nitrogen into a region of a semiconducting substrate, and forming a gate dielectric above the region in the substrate. The method further comprises forming a gate conductor above the gate dielectric and forming at least one source/drain region. The present invention is also directed to a transistor having a gate dielectric positioned above a surface of a semiconducting substrate, the gate dielectric being comprised of a nitrogen bearing oxide having a nitrogen concentration ranging from approximately 4–8%. The transistor further comprises a gate conductor positioned above the gate dielectric and at least one source/drain region.

30 Claims, 2 Drawing Sheets

METHOD OF MAKING HIGH PERFORMANCE TRANSISTORS USING CHANNEL MODULATED IMPLANT FOR ULTRA THIN OXIDE FORMATION

BACKGROUND OF THE INVENTION

1. Field of the Invention

The present invention is generally related to semiconductor processing, and, more particularly, to the manufacture transistors having ultra thin gate dielectric layers.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. Generally, at least in the field of microprocessors, the larger the drive current through a transistor, the faster the transistor, and devices comprised of such transistors, will operate.

As is well known to those skilled in the art, the drive current is a function of, among other things, the voltage applied across the transistor. The operating voltage of modern semiconductor devices has continued to decrease over the years. One reason for the decrease in the operating voltage is that it reduces the amount of power consumed by the device when it is operating. Reducing power consumption may be useful in many applications, e.g., portable computers, due to the limited life of the batteries used in such devices for power. However, while decreasing the operating voltage of modern semiconductor devices has reduced the power consumed by such devices, it has also, all other things being equal, resulted in a decrease in the drive current through the transistor. As stated above, reductions in the drive current through a transistor tend to reduce the ability of semiconductor devices, e.g., microprocessors, to operate at increasingly faster speeds. All other things being equal, one way to increase the drive current, and thus operating speed of semiconductor devices, is to reduce the thickness of the gate dielectric, typically a layer of silicon dioxide. Thus, there is a drive within the semiconductor industry to reduce the thickness of the gate dielectric layers used in semiconductor devices to increase the speed of operation of the device.

There are also other problems associated with modern gate dielectric layers used in integrated circuit devices. For example, in PMOS transistors, the gate conductor is typically doped with a P$^+$ dopant material such as boron. However, the boron dopant tends to penetrate the gate dielectric layer and the surface of the silicon substrate. One problem such penetration causes is it tends to lower the threshold voltage of the semiconductor device, thus making breakdown a greater possibility. Moreover, the boron penetration of the gate dielectric layer tends to degrade the quality of the gate dielectric. In effect, if there is enough boron penetration, the life of the transistor may be dramatically shortened. Additionally, for NMOS technology, hot carrier currents can be problematic. By way of background, hot carrier currents are electrons traveling between the source and drain of a transistor that pass through the gate oxide to the gate conductor. In effect, these hot carrier currents tunnel through the gate dielectric layer. This problem can also reduce the life expectancy of a semiconductor device.

The present invention is directed to a method and semiconductor device for solving some or all of the aforementioned problems.

SUMMARY OF THE INVENTION

The present invention is directed to a semiconductor device having an ultra thin gate dielectric and a method for making same. The method is comprised of implanting nitrogen into a region of a semiconducting substrate, and forming a gate dielectric above the region in the substrate. The method further comprises forming a gate conductor above the gate dielectric and forming at least one source/drain region. The present invention is also directed to a transistor having a gate dielectric positioned above a surface of a semiconducting substrate, the gate dielectric being comprised of a nitrogen bearing oxide having a nitrogen concentration ranging from approximately 4–8%. The transistor further comprises a gate conductor positioned above the gate dielectric and at least one source/drain region.

BRIEF DESCRIPTION OF THE DRAWINGS

The invention may be understood by reference to the following description taken in conjunction with the accompanying drawings, in which like reference numerals identify like elements, and in which.

Figure 1:
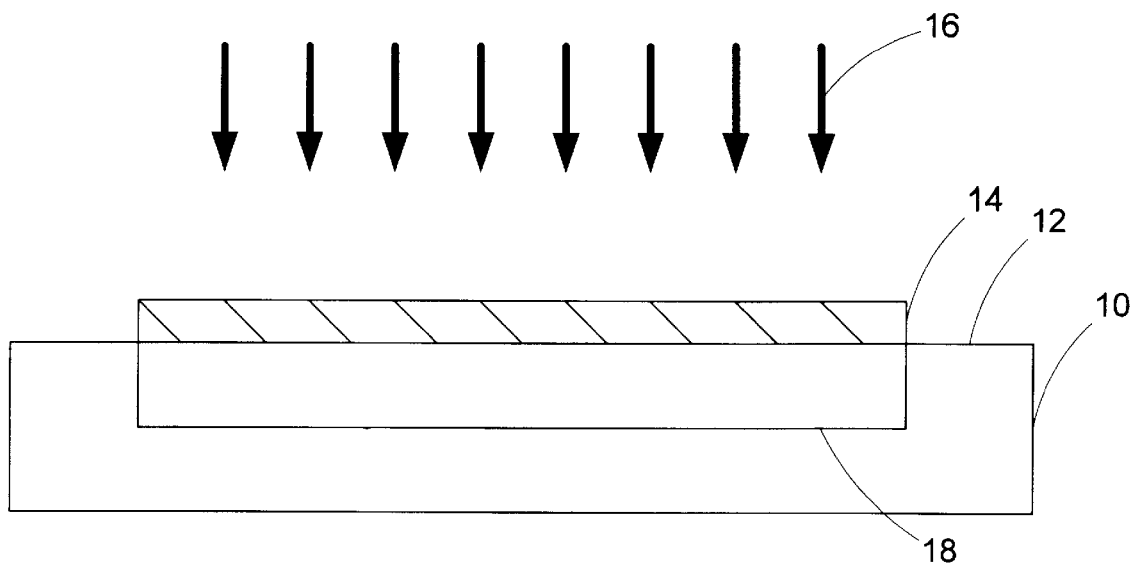
FIG. 1 is a cross-sectional view of a partially-formed integrated circuit device having a process layer formed above a semiconducting substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–3. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards a semiconductor device, e.g., a transistor, having a very thin gate dielectric, and a method for making same. In general, the method comprises forming a gate dielectric above a region of a substrate that has previously been implanted with nitrogen. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

As shown in FIG. 1, a process layer 14 is formed above the surface 12 of a semiconducting substrate 10. Of course, the term "substrate" should be understood to include any epitaxial layers of the semiconducting material. In one illustrative embodiment, the substrate 10 is comprised of silicon. In one illustrative embodiment, the process layer 14 is comprised of a nitrogen bearing oxide having a thickness ranging from approximately 50–200 Å. The process layer 14 may be formed by a variety of methods such as plasma deposition, thermal growing, chemical vapor deposition, low pressure chemical vapor deposition, or like processes.

In one illustrative embodiment, the process layer 14 is comprised of a nitrogen bearing layer of silicon dioxide. Such an illustrative process layer 14 may be grown in the presence of a nitrogen bearing gas, such as nitrous oxide ($N_2O$), nitric oxide (NO), or combinations of both. Using the methods described herein, the process layer 14 may be formed so as to have a nitrogen concentration ranging from approximately 2–5%. The plasma deposition process, if used, may be carried out at a temperature ranging from 100–350° C. for approximately 30–120 seconds. If the process layer 14 comprised of a nitrogen bearing oxide is thermally grown, that process may be carried out at a temperature of 750–900° C. in a tube furnace (for a period of 2–10 minutes), or by a rapid thermal anneal process at a temperature of approximately 800–1000° C. (for a period of 10–60 seconds).

After the formation of the process layer 14, the substrate 12 is subjected to a nitrogen implantation process as indicated by the arrows 16 in FIG. 1. This process results in nitrogen being implanted into the region 18 in the substrate 12. The nitrogen may be either diatomic ($N_{28}$) or monatomic ($N_{14}$) nitrogen. The implantation may be accomplished by an ion implantation process at an energy ranging from 10–60 keV and a concentration of $5 \times 10^{13}$–$5 \times 10^{15}$ ions/cm$^2$. In one illustrative embodiment, the nitrogen implantation process was performed at an energy level of 20 keV and a concentration of $5 \times 10^{14}$ ions/cm$^2$. The dopant concentration and energy level are selected such that the peak of the dopant profile occurs slightly below the surface 12 of the silicon 10, e.g., at approximately 200 Å beneath the surface 12 of the substrate 10. In this particular embodiment of the invention, the process layer 14 acts as an implant oxide layer that de-channels the nitrogen ions during the implantation process, and insures a more even distribution of the nitrogen ions in the substrate 10.

However, the present inventive process does not require the use of the process layer 14. That is, the nitrogen may be directly implanted into the substrate 10. Through use of this technique, fewer process steps may be employed in manufacturing semiconductor devices, e.g., the steps required to form the process layer 14 may be omitted. However, implanting the nitrogen through the process layer 14 comprised of a nitrogen bearing oxide tends to increase the nitrogen concentration in the region 18 of the substrate 10. The next process involves removal of the process layer 14. This may be accomplished by a variety of techniques, such as wet or dry etching. In one illustrative embodiment, the process layer 14 is removed by a 10:1 hydrofluoric acid wet etching process for approximately 1 minute.

Figure 2:
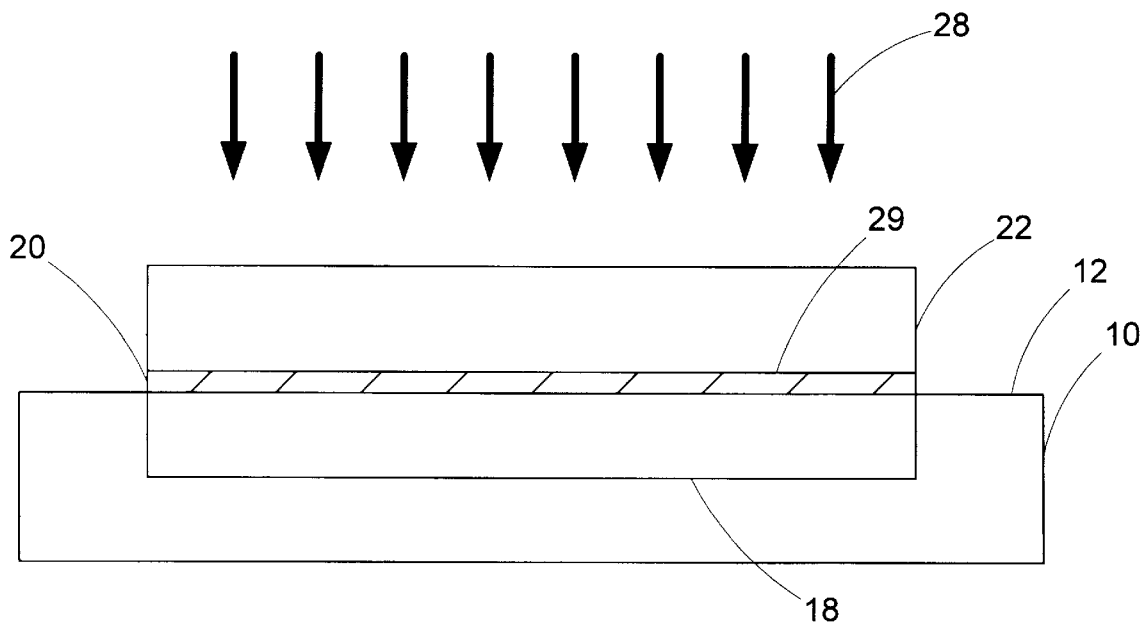
FIG. 2 is a cross-sectional view of the device shown FIG. 1 after the process layer has been removed and another process layer and a gate conductor material has been formed above the semiconducting substrate.

Thereafter, as shown in FIG. 2, a process layer 20 may be formed above the region 18 in the substrate 10. The process layer 20 may be comprised of a variety of materials that will ultimately be the gate dielectric of a transistor, such as silicon dioxide or a nitrogen bearing oxide, e.g., nitrogen doped silicon dioxide, nitrogen doped oxynitride, , or other nitrogen doped oxides. In one illustrative embodiment, the process layer 20 is comprised of a nitrogen bearing layer of silicon dioxide that may be thermally grown in accordance with the processes outlined above with respect to the process layer 14 comprised of a nitrogen bearing oxide. The nitrogen previously implanted into the region 18 of the substrate 10 reduces the rate at which the surface 12 of the substrate 10 is oxidized. For example, if a layer of silicon dioxide would otherwise be grown at a thickness of 20–30 Å, the same process parameters would result in the formation of a layer of silicon dioxide having a thickness ranging between 15–25 Å.

If it is desired to increase the nitrogen concentration in the process layer 20 further, the process layer 20 may be subjected to an additional plasma anneal in the presence of nitrogen (diatomic or monatomic, or combinations thereof) at a temperature of approximately 100–350° C. for a time period ranging from 20–120 seconds. This process results in the process layer 20 having a nitrogen concentration ranging from approximately 4–8%. Additionally, the process layer 20 may be, if desired, subjected to a rapid thermal anneal process in the presence of ammonium ($NH_3$) at a temperature ranging from approximately 800–1050° C. for approximately 10–60 seconds. The latter anneal step may be useful in passivating the traps in the process layer 20.

Thereafter, as shown in FIG. 2, a process layer 22 may be formed above the process layer 20. The process layer 22 is comprised of a gate conductor material, such as polysilicon or a metal, e.g., aluminum, titanium, tantalum, etc. The thickness of the process layer 22 may be varied as a matter of design choice. In one illustrative embodiment, the process layer 22 is comprised of polysilicon having a thickness ranging from 1000–2000 Å that is formed by a deposition process, e.g., low pressure chemical vapor deposition (LPCVD), chemical vapor deposition (CVD), etc. Thereafter, as indicated by the arrows 28, the process layer 22 may be subjected to a nitrogen implantation process. For example, the process layer 22 may be subjected to a nitrogen (diatomic or monatomic) implantation process at an energy level of 10–70 keV at a concentration of $8 \times 10^{13}$–$8 \times 10^{15}$ ions/cm$^2$. The energy level and nitrogen concentration may be selected such that the peak of the dopant profile extends just beneath a surface 29 of the process layer 20. This implantation process, indicated by arrows 28, may be useful in, for example, PMOS transistors to prevent boron dopant atoms from penetrating into the process layer 20. Using the techniques disclosed herein, the process layer 22 comprised of a gate conductor material may have a nitrogen concentration ranging from approximately 2–8%.

Figure 3:
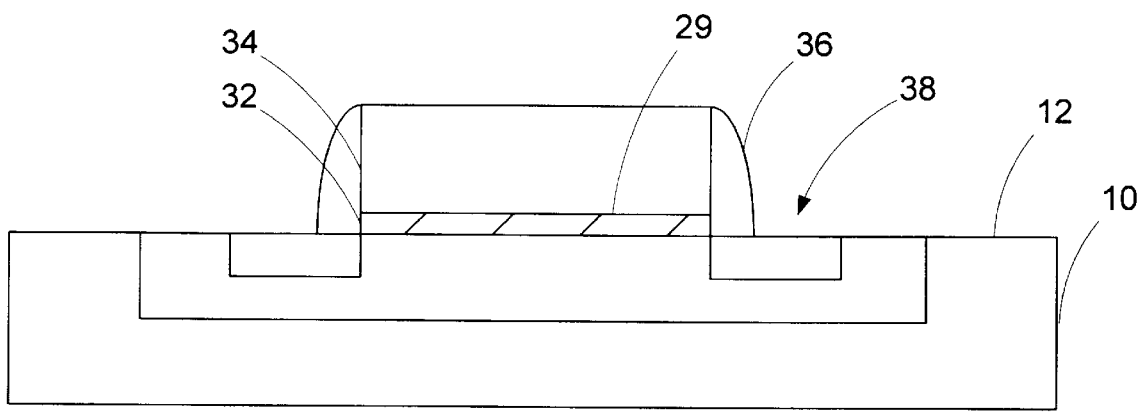
FIG. 3 is one illustrative embodiment of a semiconductor device in accordance with the present invention.

Thereafter, as shown in FIG. 3, normal transistor processing is continued. For example, the process layers 20 and 22 are patterned to result in the gate dielectric 32 and gate conductor 34. Additionally, a plurality of sidewall spacers 36 and source/drain regions 38 are formed in the substrate using traditional manufacturing techniques.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device above a semiconducting substrate, said substrate having a surface, comprising:

implanting nitrogen directly into a region of said substrate prior to forming a gate dielectric above said substrate;

forming a gate dielectric above said region of said substrate;

forming a gate conductor above said gate dielectric; and forming at least one source/drain region.

2. The method of claim 1, wherein implanting nitrogen into a region of said substrate comprises implanting nitrogen into a region of said substrate at an energy level ranging from 10–60 keV and at a concentration ranging from $5 \times 10^{13}$–$5 \times 10^{15}$ ion/cm$^2$.

3. The method of claim 1, wherein implanting nitrogen into a region of said substrate comprises implanting nitrogen into a region of said substrate at an energy level of approximately 20 keV and at a concentration of approximately $5 \times 10^{14}$ ions/cm$^2$.

4. The method of claim 1, wherein forming a gate dielectric above said region of said substrate comprises forming a process layer comprised of a gate dielectric material and patterning said layer comprised of a gate dielectric material.

5. The method of claim 1, wherein forming a gate conductor above said gate dielectric comprises forming a process layer comprised of a gate conductor material and patterning said layer comprised of a gate conductor material.

6. The method of claim 1, wherein forming a gate dielectric above said region of said substrate comprises forming a layer of nitrogen bearing oxide above said surface of said substrate.

7. The method of claim 6, further comprising subjecting the layer of nitrogen bearing oxide to a plasma anneal process in the presence of nitrogen at a temperature ranging from approximately 100–350° C. for a time ranging from approximately 20–120 seconds.

8. The method of claim 6, further comprising subjecting the nitrogen bearing oxide to a rapid thermal anneal process in the presence of ammonia at a temperature ranging from approximately 800–1050° C. for approximately 10–60 seconds.

9. The method of claim 1, wherein forming a gate dielectric above said region of said substrate comprises forming a layer of nitrogen bearing oxide comprised of 4–8% nitrogen above said region of said substrate.

10. The method of claim 1, wherein forming a gate dielectric above said region of said substrate comprises thermally growing a layer of nitrogen bearing oxide comprised of 4–8% nitrogen above said surface of said substrate.

11. The method of claim 1, wherein forming a gate dielectric above said region of said substrate comprises the plasma deposition of a layer of nitrogen bearing oxide comprised of 4–8% nitrogen above said region of said substrate.

12. The method of claim 1, wherein forming a gate conductor above said gate dielectric comprises forming a layer of a gate conductor material above said gate dielectric and implanting nitrogen through said gate conductor material and into said gate dielectric.

13. The method of claim 1, wherein forming a gate conductor above said gate dielectric comprises forming a layer of a gate conductor material above said gate dielectric and implanting nitrogen through said gate conductor material and into said gate dielectric at an energy level ranging from approximately 10–70 keV and a concentration ranging from approximately $8 \times 10^{13}$–$8 \times 10^{15}$ ions/cm$^2$.

14. A method of forming a semiconducting device above a semiconducting substrate, said substrate having a surface, comprising:

forming a process layer comprised of a nitrogen bearing oxide above said surface of said substrate;

implanting nitrogen through said layer of nitrogen bearing oxide and into a region of said substrate prior to forming a gate dielectric above said substrate;

removing said process layer comprised of a nitrogen bearing oxide prior to forming said gate dielectric:

forming a gate dielectric above said region of said substrate;

forming a gate conductor above said gate dielectric; and forming at least one source/drain region.

15. The method of claim 14, wherein forming a process layer comprised of a nitrogen bearing oxide above said surface of said substrate comprises forming a process layer comprised of an oxide having a nitrogen concentration ranging from approximately 4–8% above said surface of said substrate.

16. The method of claim 14, wherein forming a process layer comprised of a nitrogen bearing oxide above said surface of said substrate comprises forming a process layer comprised of an oxide having a nitrogen concentration ranging from approximately 4–8% by a plasma deposition process at a temperature ranging from approximately 100–350° C. for a time ranging from approximately 30–120 seconds above said surface of said substrate.

17. The method of claim 14, wherein forming a process layer comprised of a nitrogen bearing oxide above said surface of said substrate comprises forming a process layer comprised of an oxide having a nitrogen concentration ranging from approximately 4–8% by a thermal growing process at a temperature ranging from approximately 750–900° C. above said surface of said substrate.

18. The method of claim 14, wherein implanting nitrogen through said layer of nitrogen bearing oxide into a region of said substrate comprises implanting nitrogen into a region of said substrate at an energy level ranging from 10–60 keV and at a concentration ranging from $5 \times 10^{13}$–$5 \times 10^{15}$ ion/cm$^2$.

19. The method of claim 14, wherein implanting nitrogen through said layer of nitrogen bearing oxide into a region of said substrate comprises implanting nitrogen into a region of said substrate at an energy level of approximately 20 keV and at a concentration of approximately $5 \times 10^{14}$ ions/cm$^2$.

20. The method of claim 14, wherein forming a gate dielectric above said region of said substrate comprises forming a process layer comprised of a gate dielectric material and patterning said layer comprised of a gate dielectric material.

21. The method of claim 14, wherein forming a gate conductor above said gate dielectric comprises forming a process layer comprised of a gate conductor material and patterning said layer comprised of a gate conductor material.

22. The method of claim 14, further comprising removing said layer of nitrogen bearing oxide.

23. The method of claim 14, wherein forming a gate dielectric above said region of said substrate comprises forming a layer of nitrogen bearing oxide above said surface of said substrate.

24. The method of claim 23, further comprising subjecting the layer of nitrogen bearing oxide to a rapid thermal anneal process in the presence of ammonia at a temperature ranging from approximately 800–1050° C. for approximately 10–60 seconds.

25. The method of claim 14, wherein forming a gate conductor above said gate dielectric comprises forming a layer of a gate conductor material above said gate dielectric and implanting nitrogen through said gate conductor material and into said gate dielectric.

26. The method of claim 14, wherein forming a gate conductor above said gate dielectric comprises forming a layer of a gate conductor material above said gate dielectric and implanting nitrogen through said gate conductor material and into said gate dielectric at an energy level ranging from approximately 10–70 keV and a concentration ranging from approximately $8 \times 10^{13}$–$8 \times 10^{15}$ ions/cm$^2$.

27. A method of forming a semiconductor device above a semiconducting substrate, said substrate having a surface, comprising:

thermally growing a layer of nitrogen bearing silicon dioxide above said surface of said substrate;

implanting nitrogen through said layer of nitrogen bearing silicon dioxide and into a region of said substrate prior to forming a gate dielectric above said substrate, said implantation at an energy level of 10–60 keV and at a concentration ranging from approximately $5 \times 10^{13}$–$5 \times 10^{15}$ ions/cm$^2$;

removing said thermally grown layer of nitrogen bearing silicon dioxide;

thermally growing a gate dielectric layer comprised of a nitrogen bearing oxide having a nitrogen concentration ranging from approximately 4–8%;

forming a gate conductor layer above said thermally grown gate dielectric layer;

patterning said thermally grown gate dielectric layer and said gate conductor layer; and forming at least one source/drain region.

28. The method of claim 27, further comprising subjecting said thermally grown dielectric layer to a rapid thermal anneal process in the presence of ammonia at a temperature ranging from approximately 800–1050° C. for approximately 10–60 seconds.

29. The method of claim 27, wherein forming a gate conductor layer above said thermally grown gate dielectric layer comprises forming a layer of gate conductor material above said thermally grown gate dielectric and implanting nitrogen through said gate conductor material and into said thermally grown gate dielectric.

30. The method of claim 27, wherein forming a gate conductor layer above said thermally grown gate dielectric layer comprises forming a layer of gate conductor material above said thermally grown gate dielectric and implanting nitrogen at an energy level ranging from approximately 10–70 keV and at a concentration ranging from approximately $8 \times 10^{13}$–$8 \times 10^{15}$ ions/cm$^2$ through said gate conductor material and into said thermally grown gate dielectric.

* * * * *